US011751363B2

(12) United States Patent
Mulcahy et al.

(10) Patent No.: US 11,751,363 B2
(45) Date of Patent: *Sep. 5, 2023

(54) POWER MODULE OPERABLE IN A HAZARDOUS ENVIRONMENT

(71) Applicant: Astrodyne TDI, Hackettstown, NJ (US)

(72) Inventors: Gary Mulcahy, Flanders, NJ (US); Matthew Joseph Fuhrmann, Mine Hill, NJ (US); Tunc Icoz, Whitehouse Station, NJ (US)

(73) Assignee: Astrodyne TDI, Hackettstown, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/643,889

(22) Filed: Dec. 13, 2021

(65) Prior Publication Data

US 2022/0174838 A1 Jun. 2, 2022

Related U.S. Application Data

(63) Continuation of application No. 16/949,625, filed on Nov. 6, 2020, now Pat. No. 11,202,395.

(51) Int. Cl.
*H05K 7/20* (2006.01)
*H02M 7/00* (2006.01)

(52) U.S. Cl.
CPC ............ *H05K 7/209* (2013.01); *H02M 7/003* (2013.01)

(58) Field of Classification Search
None
See application file for complete search history.

(56) References Cited

U.S. PATENT DOCUMENTS

| 9,353,446 | B2 | 5/2016 | Mulcahy et al. | |
| 9,510,466 | B2* | 11/2016 | Yang | H05K 5/0039 |
| 9,596,791 | B2* | 3/2017 | Sakuma | H05K 7/20909 |
| 9,681,565 | B2* | 6/2017 | Escamilla | H05K 5/065 |
| 10,420,256 | B1* | 9/2019 | Nakamura | H05K 7/20254 |
| 11,026,349 | B2* | 6/2021 | Taylor | H05K 5/069 |
| 2007/0133171 | A1* | 6/2007 | Cheon | H05K 7/20772 |
| | | | | 361/699 |
| 2013/0299232 | A1* | 11/2013 | Fitz-Patrick | H05K 7/20636 |
| | | | | 174/547 |
| 2014/0262150 | A1* | 9/2014 | Icoz | H05K 7/20927 |
| | | | | 165/80.2 |
| 2015/0354902 | A1* | 12/2015 | McDonald | H05K 7/20336 |
| | | | | 165/45 |

(Continued)

*Primary Examiner* — Courtney L Smith
(74) *Attorney, Agent, or Firm* — Boisbrun Hofman, PLLC

(57) ABSTRACT

A power module and method of forming the same. The power module includes an extruded tube with internal and external fins, first and second opposing surfaces defining ends thereof, and an internal slot for housing a power converter. The power module includes a bottom plate having a first depression to receive a first O-ring to provide a first liquid-tight fluid seal at the first opposing surface for an electrically insulating oil encapsulating the power converter. The power module includes a cable interface plate having a second depression to receive a second O-ring to provide a second liquid-type fluid seal at the second opposing surface for the electrically insulating oil encapsulating the power converter. The power module includes an end cap to mate with the cable interface plate and accept a conduit fitting to enable an electrical cable to be routed from within the end cap to an external connection point.

20 Claims, 10 Drawing Sheets

(56) References Cited

U.S. PATENT DOCUMENTS

2018/0020571 A1* 1/2018 Saito .................... G06F 1/20
2019/0357384 A1* 11/2019 Saito .................. H05K 7/20236
2020/0185587 A1* 6/2020 Campeau ............ H01M 10/443

* cited by examiner

POWER MODULE OPERABLE IN A HAZARDOUS ENVIRONMENT

The present application is a continuation of U.S. patent application Ser. No. 16/949,625, entitled "Power Module Operable in a Hazardous Environment," filed Nov. 6, 2020, now U.S. Pat. No. 11,202,395, which is incorporated herein by reference.

FIELD OF THE INVENTION

The present invention is directed in general to power electronics and, more particularly, to a power module operable in a hazardous environment.

BACKGROUND

Power systems and modules are sometimes required to operate in physical locations where flammable, explosive, or corrosive liquids and/or vapors, or flammable floating fibers are present, such as those defined in the National Electrical Code® ANSI/NFPA 70 as Class I, Division 2. In these conditions it is important that the power system does not present an operating mode (normal or failure) that might ignite flammable materials local to the power system. Likewise, the presence of the environmental conditions should not degrade the power system safety provisions such as insulation elements or safety management protection circuits.

A typical method for managing ac-dc power conversion applications found in the industry today utilizes a non-regulated transformer-rectifier circuit. Electrical components are submersed in a non-electrically conductive oil bath in order to suppress any potential sparks or ignition events that might occur during failure modes. Likewise, an oil bath also protects the electrical components from the local environmental conditions. Therefore, it is desirable to define an approach that avoids limitations as listed hereinabove, and other problems that will be apparent to those skilled in the art. The list above is not an exhaustive compilation of challenges for constructing a power system.

A power system and module is introduced that adapts high-frequency, switch-mode ("HFSM") technology to environmentally challenging applications, especially those where compliance with safety agency hazardous location specifications, such as ISA-12.12.01 or UL 121201. Nonincendive electrical equipment for use in Class I and II, Division 2 and Class III, Divisions 1 and 2 hazardous (classified) locations is described by these specifications. These specifications cover units in locations made hazardous by the presence of flammable gases, liquids, vapors, or fibers and where ignitable concentrations are not likely to exist under normal operating conditions, but can exist under certain conditions.

SUMMARY

These and other problems are generally solved or circumvented, and technical advantages are generally achieved, by advantageous embodiments of the present invention for a power module and method of forming the same operable in a hazardous environment. In one embodiment, the power module includes an extruded tube formed with an internal fin and an external fin and a first opposing surface and a second opposing surface defining ends of the extruded tube. The extruded tube also includes an internal slot for housing a power converter. The power module includes a bottom plate formed with a first depression configured to receive a first O-ring disposed between the first opposing surface and the first depression to provide a first liquid-tight fluid seal at the first opposing surface for an electrically insulting oil encapsulating the power converter within the internal slot. The power module includes a cable interface plate formed with a second depression configured to receive a second O-ring disposed between the second opposing surface and the second depression to provide a second liquid-type fluid seal at the second opposing surface for the electrically insulting oil encapsulating the power converter within the internal slot. The power module includes an end cap configured to mate with the cable interface plate and accept a conduit fitting to enable an electrical cable to be routed from within the end cap to an external connection point.

The foregoing has outlined rather broadly the features and technical advantages of the present invention in order that the detailed description of the invention that follows can be better understood. Additional features and advantages of the invention will be described hereinafter, which form the subject of the claims of the invention. It should be appreciated by those skilled in the art that the conception and specific embodiment disclosed can be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following descriptions taken in connection with the accompanying drawings, and which.

Corresponding numerals and symbols in the different figures generally refer to corresponding parts unless otherwise indicated, and cannot be redescribed in the interest of brevity after the first instance. The FIGUREs are drawn to illustrate the relevant aspects of exemplary embodiments.

DETAILED DESCRIPTION

The making and using of the present exemplary embodiments are discussed in detail below. It should be appreciated, however, that the embodiments provide many applicable inventive concepts that can be embodied in a wide variety of specific contexts. The specific embodiments discussed are merely illustrative of specific ways to make and use the systems, subsystems, and modules associated with a system and method for design of a power system and module operable in a hazardous environment.

A system will be described herein with respect to exemplary embodiments in a specific context, namely, a broad class of power systems. The specific embodiments include, but are not limited to power systems and modules coupled to an ac input voltage source and provide a dc output voltage. The principles of the present invention are applicable to other power system designs operable from a dc input voltage that may provide an ac or a dc output voltage. A related power system is introduced in U.S. Pat. No. 9,353,446 entitled "Systems and Methods for Impressed Current Cathodic Protection," by Mulcahy, et al., issued May 31, 2016, which is incorporated herein by reference.

An objective of the disclosure is to provide a power system and module that converts locally available input power (which is typically ac utility power) into a power type and magnitude more suitable to the end application, typically isolated, low voltage dc, in a manner that meets the requirements of typical hazardous environment safety standards for nonincendive equipment. Nonincendive equipment includes equipment where any arc or thermal effect produced under normal operating conditions or otherwise, is not capable of igniting a flammable gas, vapor, dust-air mixture, fibers or flying particles surrounding the equipment.

The power system and module introduced herein address nonincendive requirements through several design approaches. The internal circuits employ solid-state electronic switches that avoid sparking metallic contacts involved in their operation. Field wiring is designed to be accomplished external to the power system and module in a junction box suitable for the targeted installation, and will typically be an explosion-proof box suitable for hazardous locations.

In addition, the power system and module should meet the requirements for a minimum of IPX5 (water spray) and IP6X (exposure to dust) ratings published by the International Electrotechnical Commission ("IEC"). Likewise, requirements for cable protection and pull-test requirements, excessive surface temperatures, and prevention of arc propagation under potential failure modes are addressed.

Figure 1:
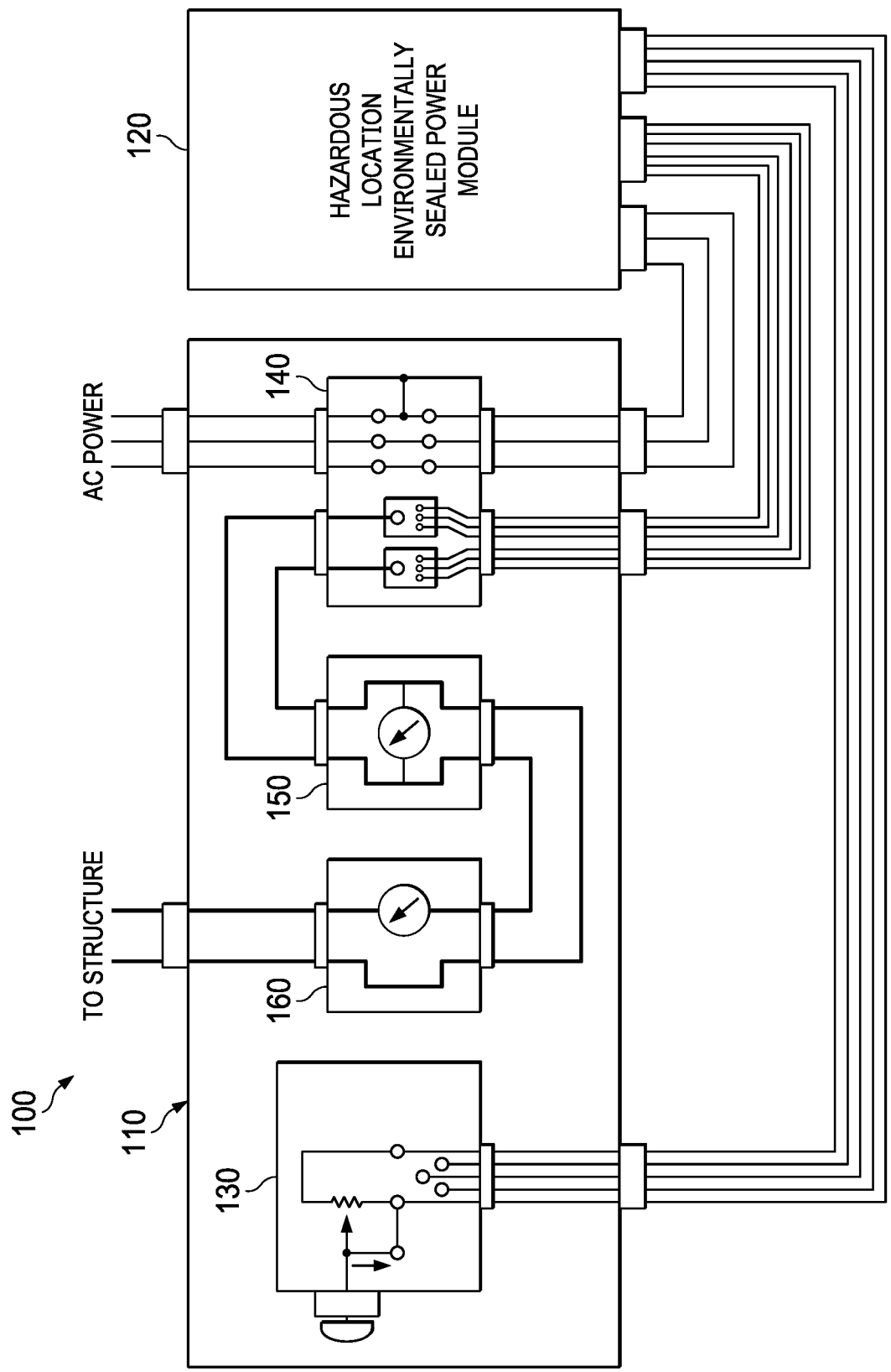
FIGS. 1 and 2 illustrate block diagrams of embodiments of power systems in certified, explosion-proof housings.

A block diagram drawing of a power system is illustrated in FIG. 1. Components include an environmentally sealed, nonincendive ac-dc power converter and a junction box suitably rated for an intended application.

Conventional physical realizations of transformer-rectifier ("TR") units designed for hazardous environments are typically large, heavy, and expensive. A TR unit designed to supply up to 2500 watts can occupy a volume greater than 4 feet by 4 feet by 6 feet (96 cubic feet) and weigh hundreds of pounds. In addition to being large and heavy, conventional TRs do not have a provision to electronically regulate and control delivered output power.

Turning now to FIG. 1, illustrated is a block diagram of an embodiment of a power system 100 in certified, explosion-proof housings. The power system 100 includes an enclosure 110 with components as set forth below and a hazardous location ("HAZLOC") environmentally sealed power module ("ESPM") 120. The enclosure 110 includes a potentiometer in an enclosed container (generally referred to as a potentiometer 130). The potentiometer 130 provides a local mechanism for controlling an output voltage or an output current (or a combination of the two or other characteristic) of the HAZLOC ESPM 120.

A power converter based on HFSM technology in the HAZLOC ESPM 120, preferably formed at least partially of an aluminum extrusion, replaces an ac, line-frequency transformer rectifier ("TR") with a module that is a small fraction of the TR's size, weight, and cost. HFSM circuits also provide an opportunity to locally or remotely electronically regulate and control delivered output power. However, circuit complexity involved in HFSM products has previously precluded their implementation in environmentally challenging applications.

As illustrated in FIG. 1, the enclosure 110 contains a Class 1 junction box 140 to enable an electrical connection to an ac power source. A voltmeter 150 is configured to sense the input ac voltage to the HAZLOC ESPM 120. An ammeter 160 is configured to sense an input current to the HAZLOC ESPM 120, and the enclosed potentiometer 130 is configured to set a reference voltage or current level or a combination thereof for the HAZLOC ESPM 120. The enclosure 110 with the aforementioned components is coupled to system loads in a building structure, and wiring that provides electrical coupling to an ac power source and to the HAZLOC ESPM 120.

The HAZLOC ESPM 120 is environmentally sealed and includes an ac-dc power converter constructed with an HFSM design that provides high power-conversion efficiency, small size, along with precise control of delivered power, current or voltage from the power converter controllable via an external interface. The switches of the power converter include a solid-state design with no internal mechanical or electromechanical switches. The power converter meets the insulation integrity and safety requirements stipulated in recognized safety standards such as Underwriters Laboratories standard UL61010-1.

The electronic assemblies contained in the sealed aluminum HAZLOC ESPM 120 are submersed in oil appropriately rated for electronics use. Encapsulation in oil achieves the dual purposes of heat management and environmental compatibility with IP65 requirements. The enclosure that houses the power converter is formed with internal and external fins for thermal management. As thus realized, the power converter is suitable for either an indoor or an outdoor location and in proximity to a hazardous environment. Field wiring is achieved though permanently attached cables that are mechanically affixed to the HAZLOC ESPM 120 chassis and protected to meet cable pull-test and durability requirements.

The hazardous location power system 100 is constructed with an environmentally sealed, nonincendive, ac-dc power converter in the HAZLOC ESPM 120 that provides desired power conversion and regulation functions. Provisions for system interface electrical connections are made in certified, explosion-proof housings. The power system 100 is formed with the lockable potentiometer 130 housed in the Class 1, Division 1 box. The voltmeter 150 and ammeter 160 measure, respectively, voltage and current supplied to the power system 100.

The power system 100 employs a technology that adapts HFSM technology to environmentally challenging applications, especially those where compliance with safety agency hazardous location specifications, such as ISA-12.12.01 or UL 121201, Nonincendive Electrical Equipment for use in Class I and II, Division 2 and Class III, Divisions 1 and 2 Hazardous (Classified) Locations. These specifications cover units in locations made hazardous by the presence of flammable gases, liquids, vapors, or fibers and where ignitable concentrations are not likely to exist under normal operating conditions but can exist under certain conditions.

A target of the technology introduced herein is an electronic power system 100 that converts locally available input power (typically ac utility power) to a power type more suitable to the end application (typically isolated, low voltage dc) in a manner that meets the requirements of typical hazardous location safety standards for nonincendive equipment. The power system 100 addresses requirements for a minimum of IPX5 (water spray) and IP6X (exposure to dust). Likewise, it also addresses requirements for cable protection and pull-test requirements, excessive surface temperatures, and prevention of arc propagation under potential failure modes.

Figure 2:
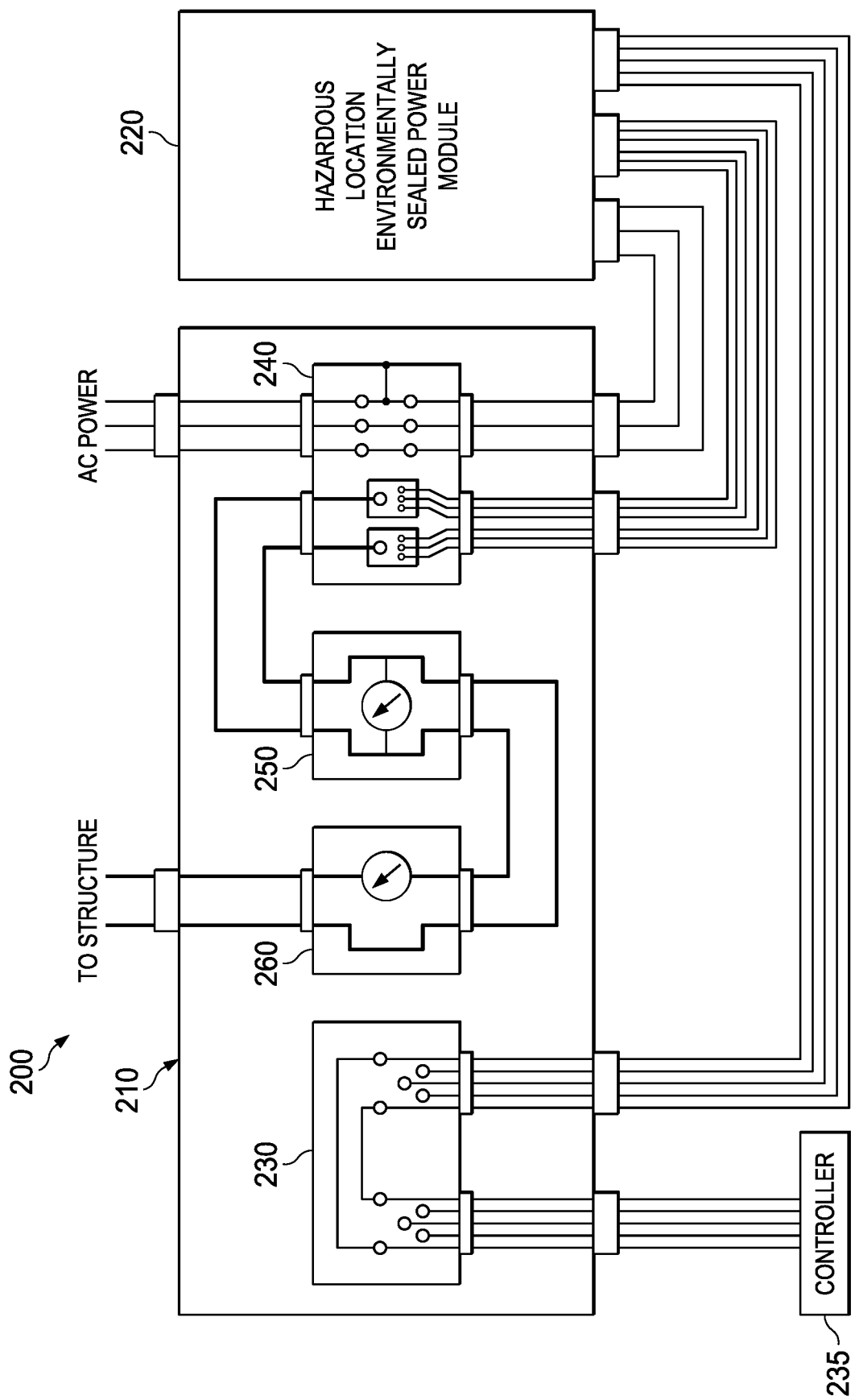

Turning now to FIG. 2, illustrated is a block diagram of an embodiment of a power system 200 in certified, explosion-proof housing. The power system 200 includes an enclosure 210 with a Class 1 junction box 240 to enable an electrical connection to an ac power source. The enclosure 210 also includes a voltmeter 250 configured to sense the input ac voltage to a HAZLOC ESPM 220, and an ammeter 260 configured to sense an input current to the HAZLOC ESPM 220. The aforementioned components operate similarly to the analogous components described above with respect to FIG. 1.

The power system 200 is coupled to a controller 235 (e.g., a computer running an energy management application) via a Class 1, Div-1 junction box 230 in the enclosure 210. The controller 235 manages the power system 200 by regulating an output voltage and/or an output current of the HAZLOC ESPM 220. While the power system 200 illustrates wired connectivity with the controller 235, it may also be possible to use wireless connectivity depending on the application. Thus, greater flexibility for final deployment of a power system is achieved, wherein electrical connections and external controls can be located locally or in a remote location from the hazardous environment.

Figure 3:
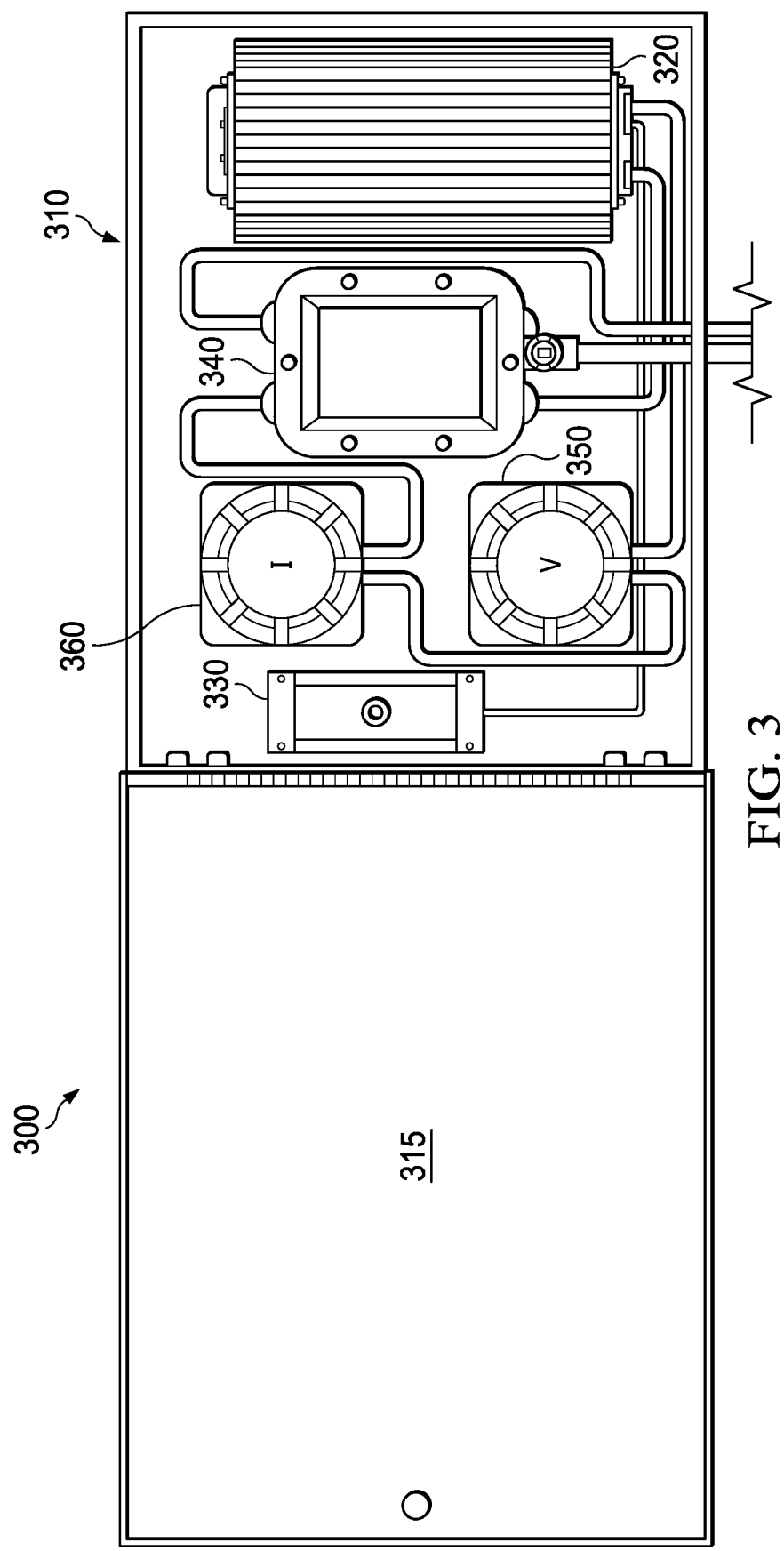
FIGS. 3 and 4 illustrate block diagrams of embodiments of power systems in a wall-mount cabinet fitted with cover.

Turning now to FIG. 3, illustrated is a block diagram of an embodiment of a power system 300 in a wall-mount cabinet 310 fitted with cover 315. The power system 300 includes a HAZLOC ESPM 320 and a potentiometer in an enclosed container (generally referred to as a potentiometer 330). The potentiometer 330 provides a local mechanism for controlling an output voltage or an output current (or a combination of the two or other characteristic) of the HAZLOC ESPM 320. A Class 1 junction box 340 enables an electrical connection to an ac power source. A voltmeter 350 is configured to sense the input ac voltage to the HAZLOC ESPM 320. An ammeter 360 is configured to sense an input current to the HAZLOC ESPM 320. The aforementioned components operate similarly to the analogous components described above with respect to FIGS. 1 and 2.

Figure 4:
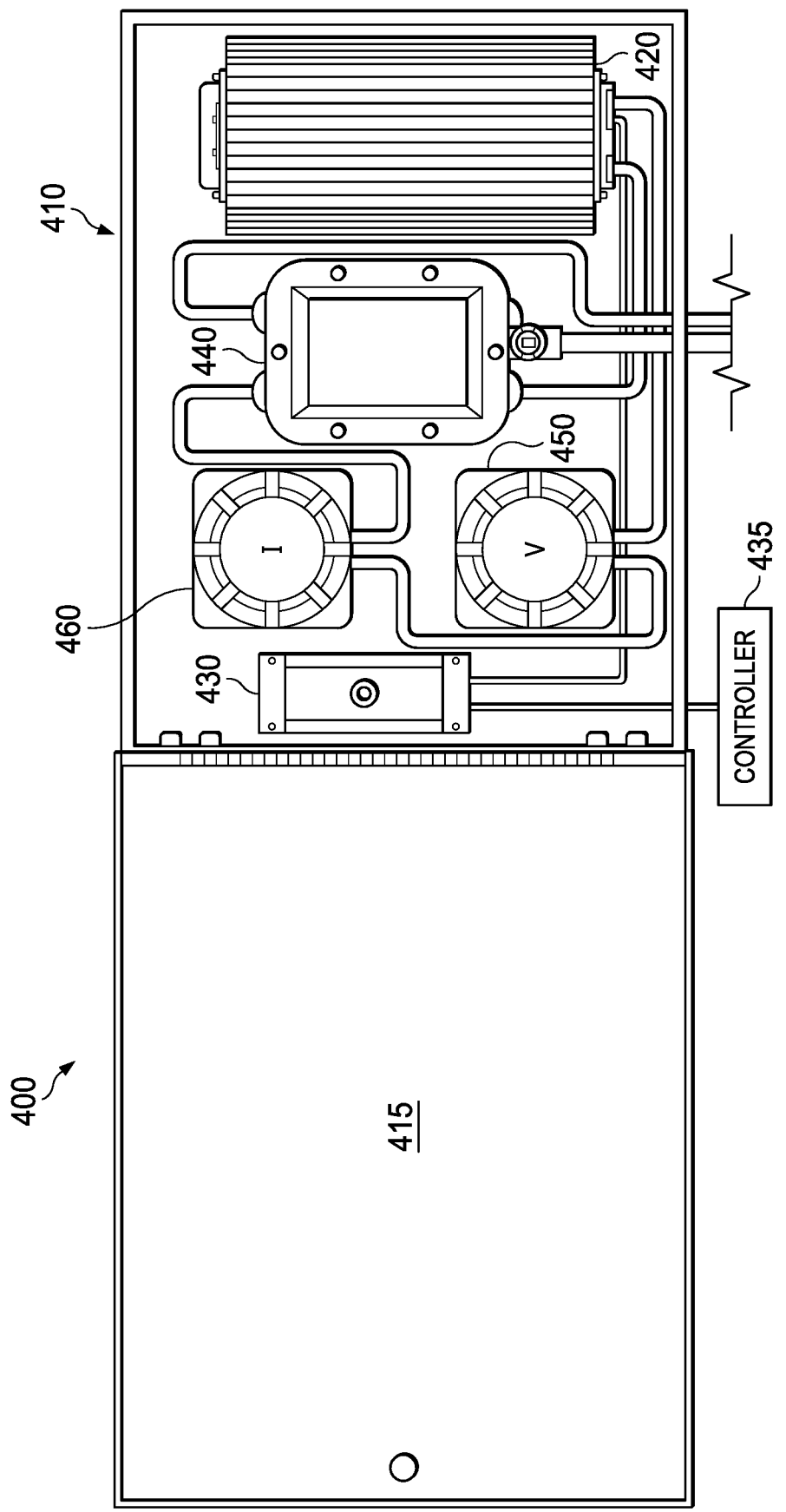

Turning now to FIG. 4, illustrated is a block diagram of an embodiment of a power system 400 in a wall-mount cabinet 410 fitted with cover 415. The power system 400 includes a HAZLOC ESPM 420 in communication with a controller 435 (e.g., a computer running an energy management application) via a Class 1, Div-1 junction box 430 in the wall-mount cabinet 410. The controller 435 manages the power system 400 by regulating an output voltage and/or an output current of the HAZLOC ESPM 420. While the power system 400 illustrates wired connectivity with the controller 435, it may also be possible to use wireless connectivity depending on the application. Thus, greater flexibility for final deployment of a power system is achieved, wherein electrical connections and external controls can be located locally or in a remote location from the hazardous environment.

A Class 1 junction box 440 enables an electrical connection to an ac power source. A voltmeter 450 is configured to sense the input ac voltage to the HAZLOC ESPM 420. An ammeter 460 is configured to sense an input current to the HAZLOC ESPM 420. The aforementioned components operate similarly to the analogous components described above with respect to FIGS. 1, 2 and 3.

Figure 5:
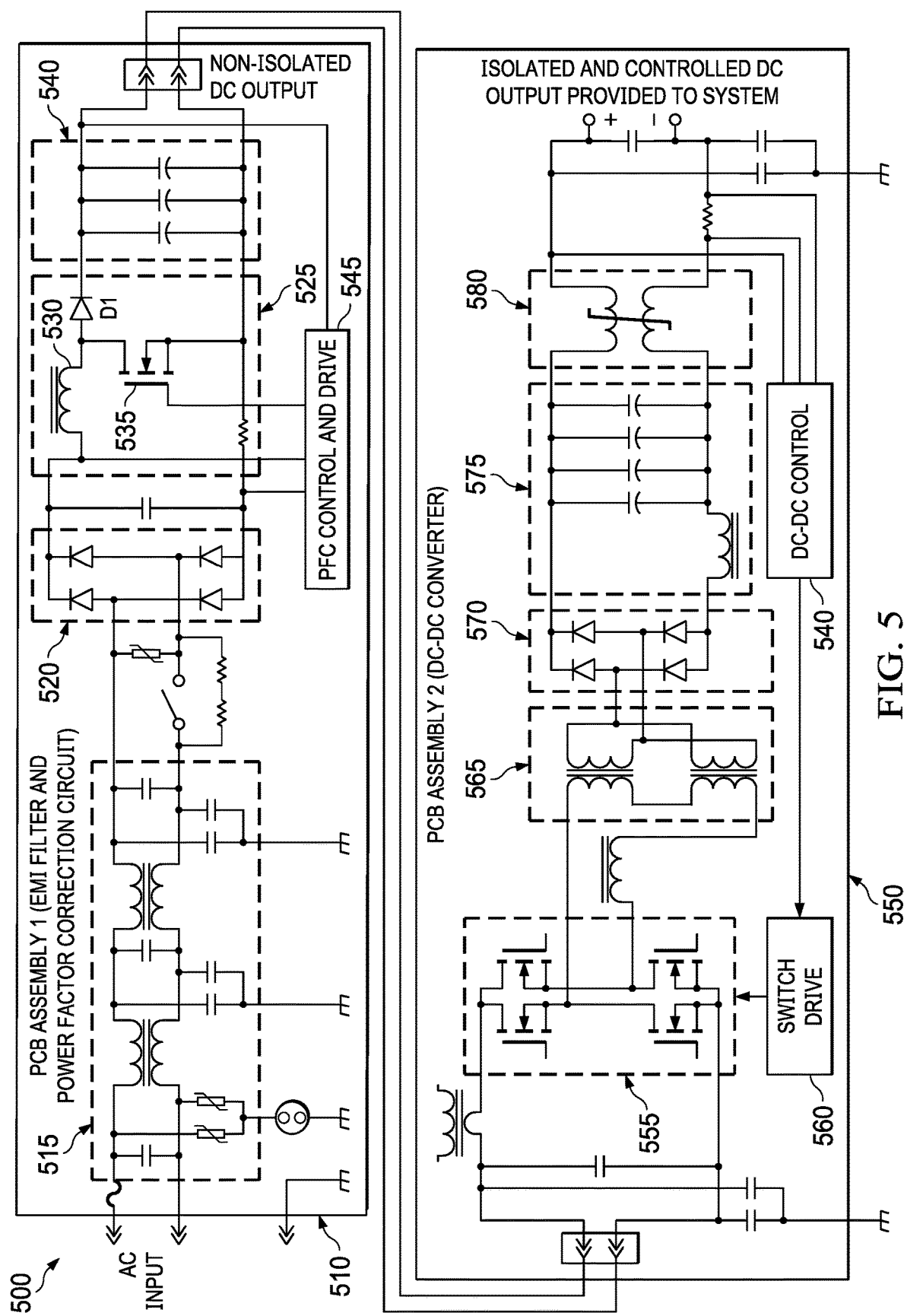
FIG. 5 illustrates a schematic diagram of an embodiment of a power converter employable with a hazardous location environmentally sealed power module.

Turning now to FIG. 5, illustrated is a schematic diagram of an embodiment of a power converter (e.g., a switched-mode power converter 500) employable with a hazardous location environmentally sealed power module. The power converter 500 converts an ac input voltage to an isolated and regulated dc output voltage. The power converter 500 is formed with a non-isolating, power-factor corrected ("PFC") boost converter stage (also referred to as a PFC boost converter stage 510) coupled to an input of an isolating, dc-dc converter stage (also referred to as a dc-dc converter stage 550).

The PFC boost converter stage 510 is formed with a multistage input EMI filter 515, formed with two common-mode chokes coupled to differential mode capacitors, coupled in turn to four-diode bridge 520 that produces a unipolar output voltage with a waveform somewhat similar to that of a rectified sinewave voltage. The unipolar output voltage of the PFC boost converter stage 510 is coupled to the input of boost converter stage 525 formed with an input inductor 530, a power switch (e.g., a metal-oxide semiconductor field-effect transistor ("MOSFET") 535) and a diode D1. The output voltage of the PFC boost converter stage 510 is filtered by the capacitor bank 540. A PFC control and drive circuit 545 provides a control signal to control an operation of the MOSFET 535.

A non-isolated dc output voltage of the PFC boost converter stage 510 is provided to an input of the dc-dc converter stage 550. The input voltage of the dc-dc converter stage 550 is switched at a high frequency (e.g., a 100 kilohertz ("kHz") or more by power switches (e.g., MOSFETs 555), controlled by switch drive circuit 560, and the resulting switched voltage waveform is coupled to input windings of isolating transformers 565. An output voltage of the isolating transformers 565 is coupled to diode bridge 570 to produce a dc output voltage from the dc-dc converter stage 550. This dc output voltage is filtered by low-pass filter 575 formed with an inductor and four capacitors, followed by common-mode inductor filter 580. A dc-dc converter controller 585 receives an isolated and controlled dc output voltage as a feedback mechanism to control the MOSFETs 555 via the switch drive circuit 560 The net result is power-factor corrected ac current is drawn from the ac input voltage, which is then converted to an isolated and regulated dc output voltage of the power converter 500.

Figure 6:
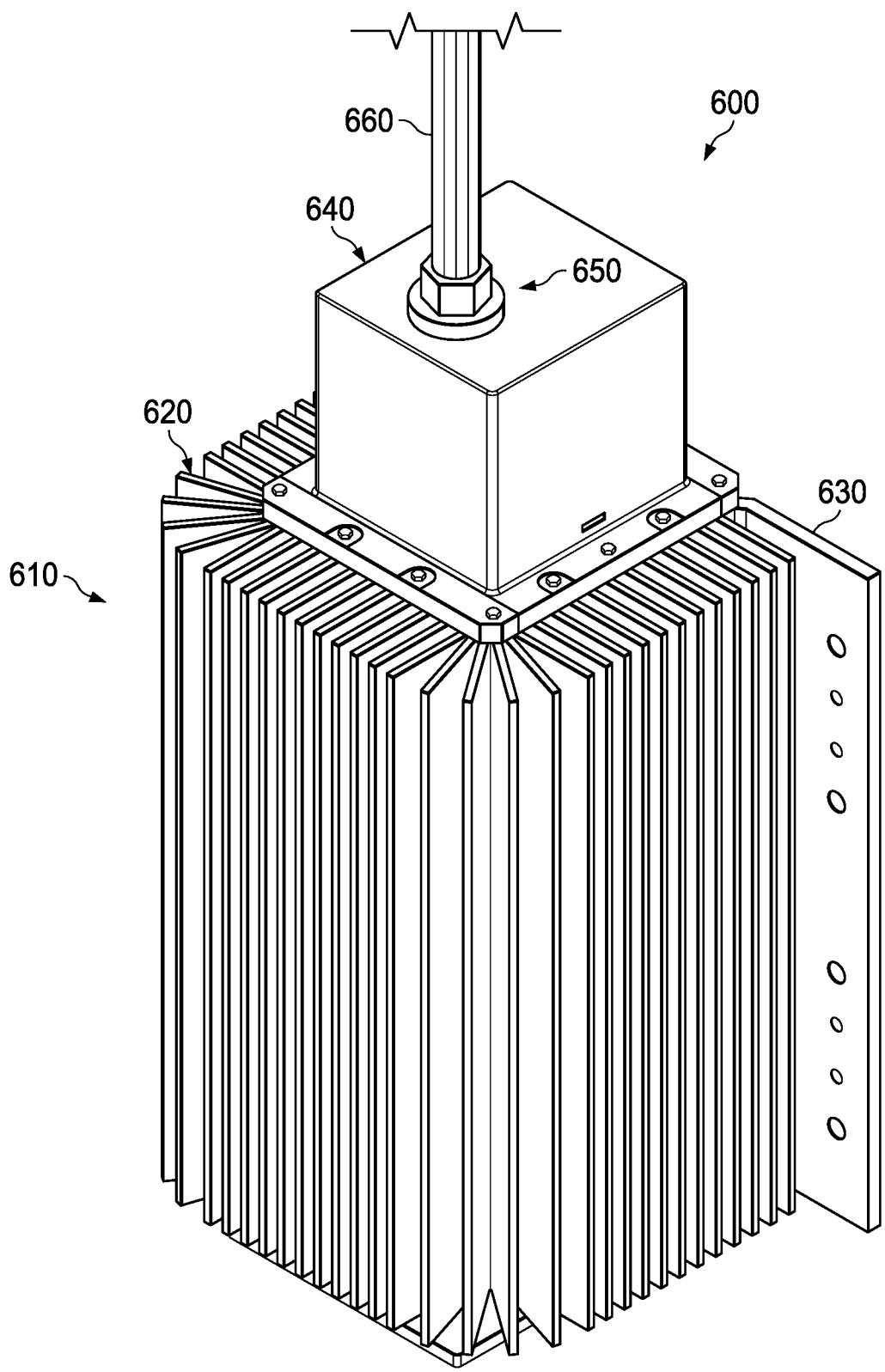
FIG. 6 illustrates an isometric diagram of an embodiment of a hazardous location environmentally sealed power module.

Turning now to FIG. 6, illustrated is an isometric diagram of an embodiment of a hazardous location ("HAZLOC") environmentally sealed power module ("ESPM") 600. The HAZLOC ESPM 600 includes an extruded tube (e.g., an extruded aluminum tube 610) with external fins 620 for thermal management and a mounting plate 630. An end cap 640 is attached to one end of the extruded aluminum tube 610. A heavy-duty strain relief conduit fitting 650 terminates the jacket of an electrical cable 660. The extruded aluminum tube 610 can be substantially filled with oil for thermal management. Ends of the extruded aluminum tube 610 are sealed liquid-tight with plates and O-rings.

Figure 7:
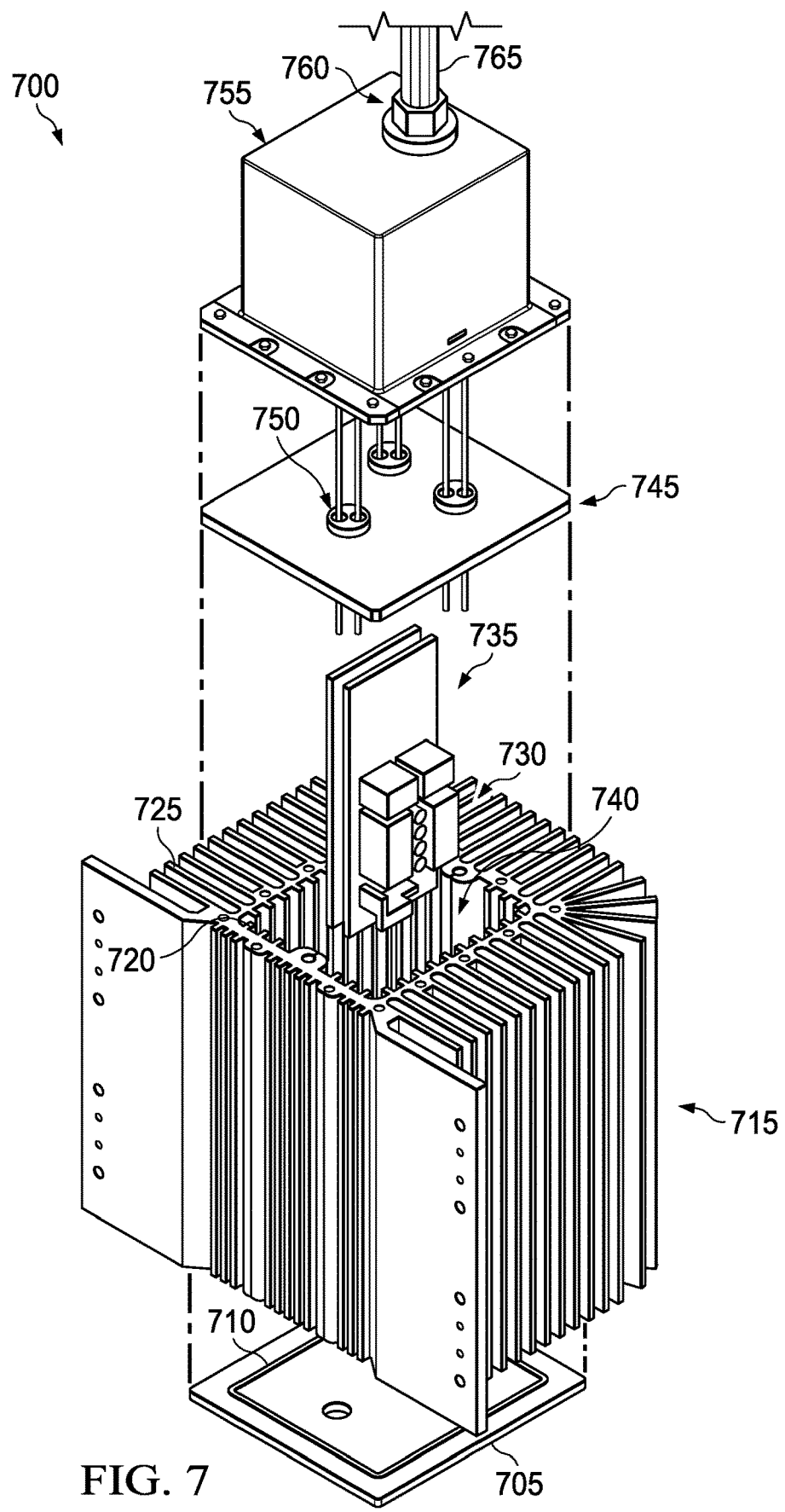
FIG. 7 illustrates a partially exploded isometric diagram of an embodiment of a hazardous location environmentally sealed power module.

Turning now to FIG. 7, illustrated is a partially exploded isometric diagram of an embodiment of a hazardous location ("HAZLOC") environmentally sealed power module ("ESPM") 700. A bottom plate 705 with an O-ring 710 is configured to be coupled to a first opposing surface of and provide a liquid-tight and hermetic seal for an extruded tube (e.g., an extruded aluminum tube 715) with internal fins 720 and external fins 725. A power converter 730 on a printed circuit board 735 is configured to be located within a compartment (or internal slots 740) defined by the internal fins 720. A cable interface plate 745 with cable glands (one of which is designated 750) is configured to be coupled to a second opposing surface of and provide a liquid-tight and hermetic seal for the extruded aluminum tube 715. An end cap 755 is configured to be attached to the cable interface plate 745 that includes a heavy-duty strain relief conduit fitting 760 terminating the jacket of an electrical cable 765. The extruded aluminum tube 715 can be substantially filled with oil for thermal management. Ends of the extruded aluminum tube 715 are sealed liquid-tight with respective plates and O-rings.

An aspect of the HAZLOC ESPM 700 is the ability to utilize commercial components, normally intended for usage in air, in an oil-encapsulated environment. This allows electronic assemblies normally intended for air-cooling to be easily adapted to an encapsulated assembly which is fully weather-proof. The use of oil is especially useful when considering magnetic components as these usually generate significant heat and are irregularly shaped, making it difficult to conduct heat from them via a hard surface. The encapsulating oil is able to penetrate the magnetic elements and transport the heat generated to the external fins 725 of the extruded aluminum tube 715 via interaction with the internal fins 720 illustrated in FIG. 7.

Figure 8:
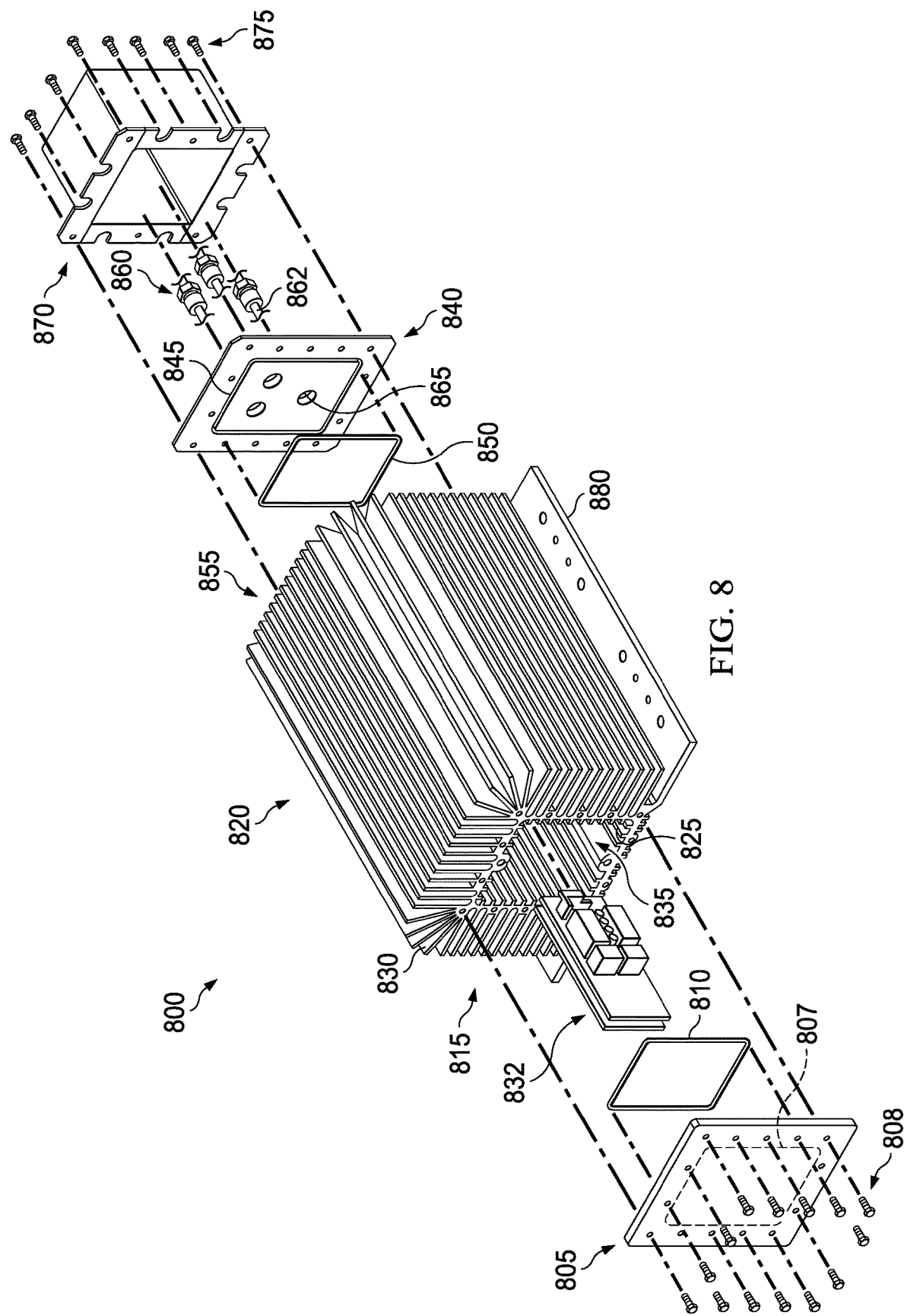
FIG. 8 illustrates an exploded isometric diagram of an embodiment of a hazardous location environmentally sealed power module.

Turning now to FIG. 8, illustrated is an exploded isometric diagram of an embodiment of a hazardous location ("HAZLOC") environmentally sealed power module ("ESPM") 800. A bottom plate 805 includes a depression 807 to receive an O-ring 810 and is configured to be coupled (via mating screws 808) to a first opposing surface 815 of and provide a liquid-tight and hermetic seal for an extruded tube (e.g., an extruded aluminum tube 820) with internal fins 825 and external fins 830. A power converter 832 is configured to be located within a compartment (or internal slots 835) defined by the internal fins 825.

A cable interface plate 840 includes a depression 845 to receive a second O-ring 850 and is configured to be coupled to a second opposing surface 855 of and provide a liquid-tight and hermetic seal for the extruded aluminum tube 820. The cable interface plate 840 is formed with three liquid-tight/hermetic cable glands (one of which is illustrated in FIG. 8 as cable gland 860) that fit in holes in the cable interface plate 840 such as hole 865 that enables an electrical cable 862 to extend into and out of the extruded aluminum tube 820 for the power converter 832 therein. The liquid-tight cable glands 860 are preferably sealed with epoxy.

An end cap 870 is configured to be attached to the cable interface plate 840 and the second opposing surface 855 (via the cable interface plate 840) with mating screws 875. The end cap 870 is configured to accept a conduit fitting to enable an electrical cable to be routed from within the end cap 870 to an external electrical connection point. The end cap 870 serves to provide protection for cables that exit from the sealed HAZLOC ESPM 800, as well as provide a mounting location for a metal conduit fitting to route cables to external electrical connection points.

The extruded aluminum tube 820 can be substantially filled with oil for thermal management. The oil may include a bio-based natural ester dielectric coolant, for example, Envirotemp™ FR3™ fluid produced by Cargill. The internal fins 825 serve to capture heat by employing an electrically insulating encapsulating oil which circulates due to convection forces as the power converter 832 heats up. The extruded aluminum tube 820 acts as an electrical shield for high frequency switch-mode waveforms produced by the power converter 832. The external fins 830 dissipate heat generated by the power converter 832 via free convection of surrounding air. The extruded aluminum tube 820 is also formed with extruded-in-place mounting feet 880. The extruded aluminum tube 820, the internal fins 825, the external fins 830, the mounting feet 880, and the internal slots 835 can be formed in one extrusion operation.

Figure 9:
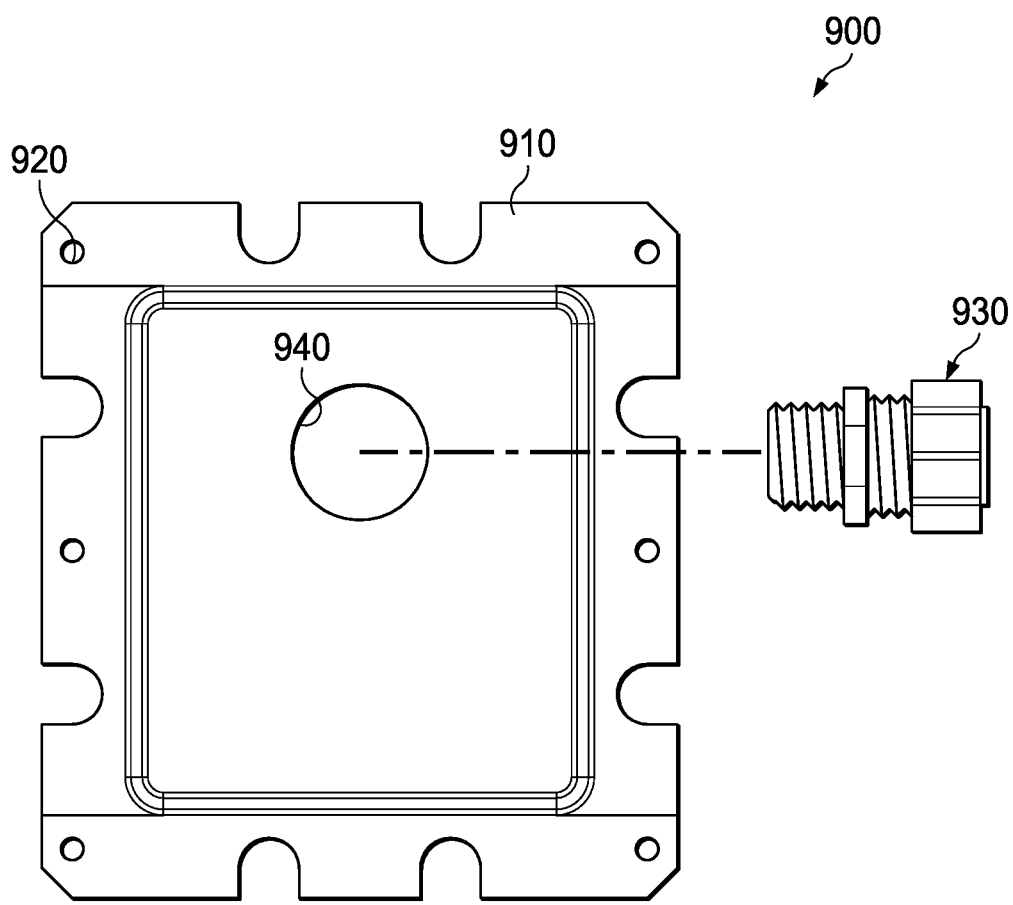
FIG. 9 illustrates a plan view of an embodiment of an end cap.

Turning now to FIG. 9, illustrated is a plan view of an embodiment of an end cap 900. The end cap 900 includes a mating flange 910 with mating holes (one of which is designated 920). The end cap 900 also includes a conduit fitting 930 sized to mount in a hole 940 in the end cap 900. The conduit fitting 930 is configured to terminate the jacket of an electrical cable.

Figure 10:
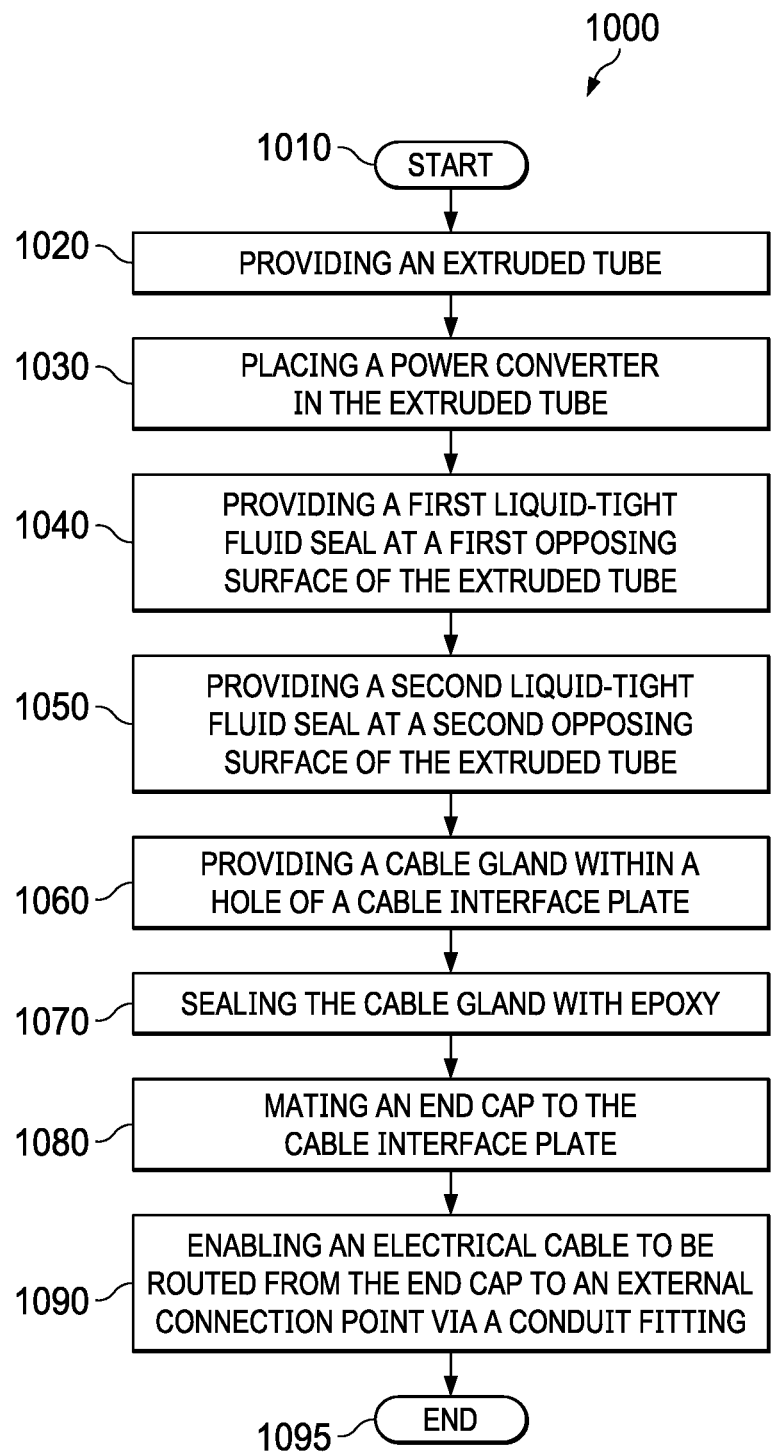
FIG. 10 illustrates a flow diagram of an embodiment of a method of forming a hazardous location environmentally sealed power module.

Turning now to FIG. 10, illustrated is a flow diagram of an embodiment of a method 1000 of forming a hazardous location ("HAZLOC") environmentally sealed power module ("ESPM"). When describing features of the HAZLOC ESPM (e.g., HAZLOC ESPM 800), the description of the method 1000 below will refer to representative FIGUREs above with corresponding reference numbers of the features. The method begins at a start step or module 1010. At a step or module 1020, the method 1000 includes providing an extruded tube (e.g., an aluminum extruded tube) formed with an internal fin and an external fin and a first opposing surface and a second opposing surface defining ends of the extruded tube. (See, e.g., FIG. 8, an extruded tube 820, internal fins 825, external fins 830, a first opposing surface 815, and a second opposing surface 855.) The first opposing surface and the second opposing surface of the extruded tube may be machined flat. The extruded tube may also include extruded in-place mounting feet. (See, e.g., FIG. 8, extruded in-place mounting feet 880.) The extruded tube, the internal fin, the external fin, and the extruded in-place mounting feet may be formed in one extrusion operation.

At a step or module 1030, the method 1000 includes placing a power converter (e.g., a switched-mode power converter 500 of FIG. 5) within an internal slot of the extruded tube. (See, e.g., FIG. 8, a power converter 832, an internal slot 835, and the extruded tube 820.) The method 1000 continues by providing a first liquid-tight fluid seal at the first opposing surface for an electrically insulting oil (e.g., including a bio-based natural ester dielectric coolant) encapsulating the power converter within the internal slot at a step or module 1040. The first liquid-tight fluid seal may be provided by a bottom plate formed with a first depression configured to receive a first O-ring disposed between the first opposing surface and the first depression. (See, e.g., FIG. 8, a bottom plate 805, a first depression 807, a first O-ring 810, and the first opposing surface 815.) The bottom plate may be secured to the first opposing surface with mating screws. (See, e.g., FIG. 8, mating screws 808.)

At a step or module 1050, the method 1000 includes providing a second liquid-type fluid seal at the second opposing surface for the electrically insulting oil encapsulating the power converter within the internal slot. The second liquid-tight fluid seal may be provided by a cable interface plate formed with a second depression configured to receive a second O-ring disposed between the second opposing surface and the second depression. (See, e.g., FIG. 8, a cable interface plate 840, a second depression 845, a second O-ring 850, and the second opposing surface 855.) The method 1000 continues with providing a liquid-tight/hermetic cable gland within a hole of the cable interface plate to enable an electrical cable to extend into and out of the HAZLOC ESPM at a step or module 1060. (See, e.g., FIG. 8, a liquid-tight/hermetic cable gland 860, a hole 865, the cable interface plate 840, and an electrical cable 862.) At a step or module 1070, the method 1000 includes sealing the liquid-tight/hermetic cable gland within the hole with epoxy. (See, e.g., FIG. 8, the liquid-tight/hermetic cable gland 860, and the hole 865.)

At a step or module 1080, the method 1000 includes mating an end cap to the cable interface plate. (See, e.g., FIG. 8, the cable interface plate 840, and an end cap 870.) The end plate and the cable interface plate may be secured to the second opposing surface with mating screws. (See, e.g., FIG. 8, mating screws 875.) The method 1000 continues with enabling an electrical cable to be routed from within the end cap to an external connection point via a conduit fitting coupled to the end cap at a step or module 1090. (See, e.g., FIG. 7, an end cap 755, a conduit fitting 760, and an electrical cable 765.) The method 1000 ends at an end step or module 1095. After the HAZLOC ESPM is formed, the HAZLOC ESPM may be controlled by a controller such as a remote controller. (See, e.g., FIG. 2, controller 235, FIG. 4, controller 435.)

Although the embodiments and its advantages have been described in detail, it should be understood that various changes, substitutions, and alterations can be made herein without departing from the spirit and scope thereof as defined by the appended claims. For example, many of the features and functions discussed above can be implemented in software, hardware, or firmware, or a combination thereof. Also, many of the features, functions, and steps of operating the same can be reordered, omitted, added, etc., and still fall within the broad scope of the various embodiments.

Moreover, the scope of the various embodiments is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein can be utilized as well. Accordingly, the appended claims are intended to include within their scope such processes, machines, manufacture, compositions of matter, means, methods, or steps.

What is claimed is:

1. A power module, comprising:
    an extruded tube formed with an internal fin and an external fin and a first opposing surface and a second opposing surface defining ends of said extruded tube, said extruded tube including an internal slot for housing a power converter;
    a bottom plate formed with a first depression configured to receive a first O-ring disposed between said first opposing surface and said first depression to provide a first liquid-tight fluid seal at said first opposing surface for an electrically insulating oil encapsulating said power converter within said internal slot; and
    a cable interface plate formed with a second depression configured to receive a second O-ring disposed between said second opposing surface and said second depression to provide a second liquid-type fluid seal at said second opposing surface for said electrically insulating oil encapsulating said power converter within said internal slot.

2. The power module as recited in claim 1 further comprising an end cap configured to mate with said cable interface plate and accept a conduit fitting to enable an electrical cable to be routed from within said end cap to an external connection point.

3. The power module as recited in claim 1 wherein said cable interface plate is further configured to receive a liquid-tight/hermetic cable gland that enables an electrical cable to extend into and out of said power module.

4. The power module as recited in claim 3 wherein said liquid-tight/hermetic cable gland is sealed with epoxy.

5. The power module as recited in claim 1 wherein said power converter is configured to be controlled by a controller remote from said power module.

6. The power module as recited in claim 1 wherein said electrically insulating oil comprises a bio-based natural ester dielectric coolant.

7. The power module as recited in claim 1 wherein said first opposing surface and said second opposing surface of said extruded tube are machined flat.

8. The power module as recited in claim 1 wherein said extruded tube comprises aluminum.

9. The power module as recited in claim 1 wherein said extruded tube is further formed with an extruded in-place mounting feet.

10. The power module as recited in claim 9 wherein said extruded tube, said internal fin, said external fin and said extruded in-place mounting feet are formed in one extrusion operation.

11. A method of forming a power module, comprising:
    providing an extruded tube formed with an internal fin and an external fin and a first opposing surface and a second opposing surface defining ends of said extruded tube;
    placing a power converter within an internal slot of said extruded tube;
    providing a first liquid-tight fluid seal at said first opposing surface for an electrically insulating oil encapsulating said power converter within said internal slot with a bottom plate formed with a first depression configured to receive a first O-ring disposed between said first opposing surface and said first depression; and
    providing a second liquid-type fluid seal at said second opposing surface for said electrically insulating oil encapsulating said power converter within said internal slot with a cable interface plate formed with a second depression configured to receive a second O-ring disposed between said second opposing surface and said second depression.

12. The method as recited in claim 11 further comprising mating an end cap to said cable interface plate, enabling an electrical cable to be routed from within said end cap to an external connection point via a conduit fitting coupled to said end cap.

13. The method as recited in claim 11 further comprising providing a liquid-tight/hermetic cable gland within a hole of said cable interface plate to enable an electrical cable to extend into and out of said power module.

14. The method as recited in claim 13 further comprising sealing said liquid-tight/hermetic cable gland within said hole with epoxy.

15. The method as recited in claim 11 further comprising controlling said power converter with a controller remote from said power module.

16. The method as recited in claim 11 wherein said electrically insulating oil comprises a bio-based natural ester dielectric coolant.

17. The method as recited in claim 11 wherein said first opposing surface and said second opposing surface of said extruded tube are machined flat.

18. The method as recited in claim 11 wherein said extruded tube comprises aluminum.

19. The method as recited in claim 11 further comprising providing extruded in-place mounting feet for said extruded tube.

20. The method as recited in claim 19 wherein said extruded tube, said internal fin, said external fin and said extruded in-place mounting feet are formed in one extrusion operation.

* * * * *